United States Patent
Ishikawa et al.

(10) Patent No.: US 9,018,969 B2
(45) Date of Patent: Apr. 28, 2015

(54) SEMICONDUCTOR DEVICE WITH ALIGNED BUMPS

(75) Inventors: Toru Ishikawa, Tokyo (JP); Machio Segawa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 266 days.

(21) Appl. No.: 13/608,138

(22) Filed: Sep. 10, 2012

(65) Prior Publication Data

US 2013/0076387 A1   Mar. 28, 2013

(30) Foreign Application Priority Data

Sep. 27, 2011   (JP) ................................ 2011-210987
Dec. 14, 2011   (JP) ................................ 2011-273703

(51) Int. Cl.
*G01R 31/26* (2014.01)
*H01L 23/48* (2006.01)
*G11C 29/02* (2006.01)
*H01L 25/065* (2006.01)

(52) U.S. Cl.
CPC .......... *G11C 29/025* (2013.01); *H01L 25/0657* (2013.01); *H01L 2224/16* (2013.01)

(58) Field of Classification Search
None
See application file for complete search history.

(56) References Cited

U.S. PATENT DOCUMENTS

| 7,965,095 | B2 | 6/2011 | Shibata | |
|---|---|---|---|---|
| 2003/0008424 | A1* | 1/2003 | Kajiwara et al. | 438/18 |
| 2003/0085461 | A1* | 5/2003 | Sakiyama et al. | 257/700 |
| 2006/0001176 | A1* | 1/2006 | Fukaishi et al. | 257/777 |
| 2009/0096478 | A1* | 4/2009 | Keeth | 324/765 |
| 2009/0153177 | A1 | 6/2009 | Shibata | |
| 2011/0093224 | A1 | 4/2011 | Ide et al. | |
| 2011/0175639 | A1 | 7/2011 | Yoko et al. | |
| 2013/0020675 | A1* | 1/2013 | Kireev et al. | 257/531 |

FOREIGN PATENT DOCUMENTS

| JP | 2009-139273 | 6/2009 |
|---|---|---|
| JP | 2011-145257 | 7/2011 |

OTHER PUBLICATIONS

European Search Report—EP 12 18 5045—Jan. 31, 2013.

* cited by examiner

*Primary Examiner* — Minh N Tang

(57) ABSTRACT

In a semiconductor device in which semiconductor chips having a number of signal TSVs are stacked, a huge amount of man-hours have been required to perform a continuity test for each of the signal TSVs. According to the present invention, no continuity test is performed directly on signal TSVs. Dummy bumps are arranged in addition to signal TSVs. The dummy bumps of the semiconductor chips are connected through a conduction path that can pass the dummy bumps between the semiconductor chips with one stroke when the semiconductor chips are stacked. A continuity test of the conduction path allows a bonding defect on bonded surfaces of two of the stacked semiconductor chips to be measured and detected.

22 Claims, 15 Drawing Sheets

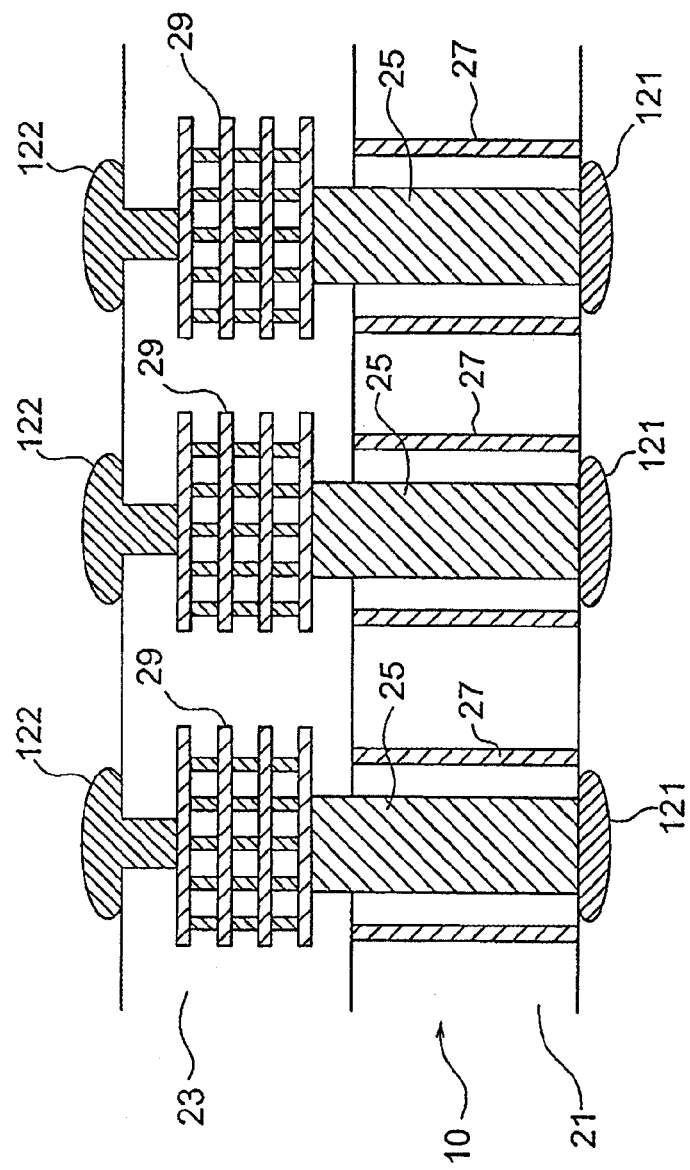
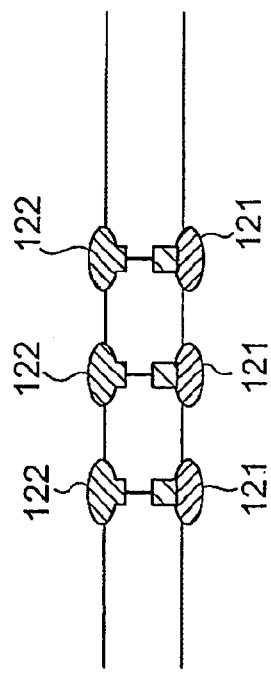
FIG. 2A
FIG. 2B

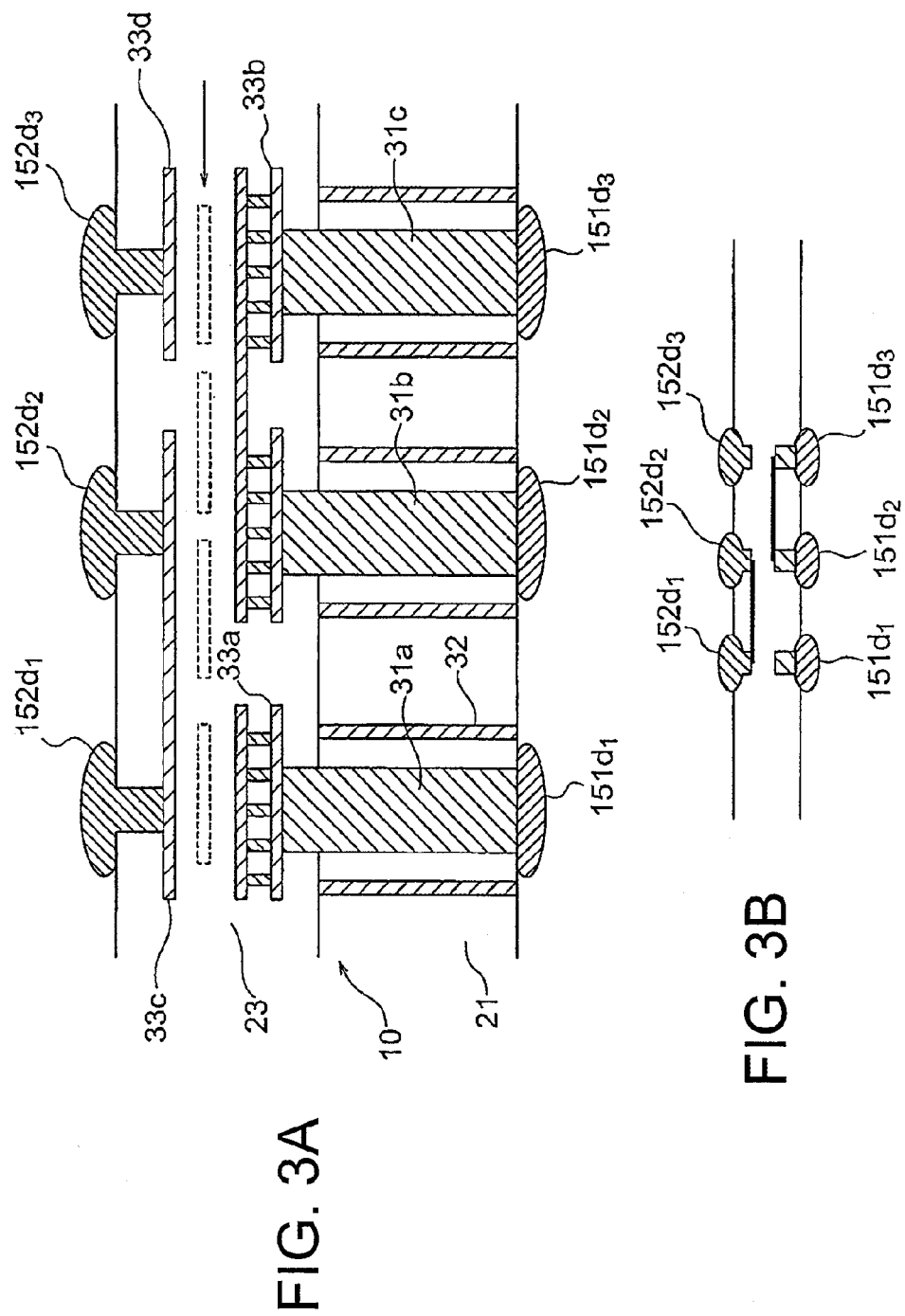

SEMICONDUCTOR DEVICE WITH ALIGNED BUMPS

This application is based upon and claims the benefit of priority from Japanese patent application No. 2011-210987, filed on Sep. 27, 2011 and Japanese patent application No. 2011-273703, filed on Dec. 14, 2011, the disclosures of which are incorporated herein in their entirety by reference.

BACKGROUND

The present invention relates to a semiconductor chip, a semiconductor device having a structure in which semiconductor chips are stacked, and a method of measuring a semiconductor device.

Recently, proposals have been made about a semiconductor device which has a multilayer structure of stacking semiconductor chips through a number of through electrodes, which are called through silicon vias (TSVs). In a semiconductor device having such a multilayer structure, a continuity test or conduction test is performed for each of TSVs after the stacking of semiconductor chips in order to determine whether or not a normal connection is established between the semiconductor chips. In this case, a continuity test is usually conducted for each of TSVs by bringing a test terminal into contact with a signal bump provided on each of the TSVs. However, since a great number of TSVs are provided in such a semiconductor device, a huge amount of man-hours are required for continuity tests if a continuity test is performed for every one of the TSVs.

In a case where a continuity test of a TSV is usually carried out after a semiconductor device has been assembled into a product, the entire product becomes defective if any defect is found between TSVs after the assembly.

Meanwhile, JR-A 2009-139273 (Patent Literature 1) discloses a multilayer semiconductor device and a continuity test method that can individually confirm a connection state of each of semiconductor chips of a semiconductor device. In order to confirm a connection state of each layer of the semiconductor chips after stacking of the semiconductor chips, a test-dedicated terminal is provided on each of the semiconductor chips, and a diode for a continuity test is connected between the test-dedicated terminal and an internal terminal.

JP-A 2011-145257 (Patent Literature 2) discloses a semiconductor device having an interface chip and a core chip separated from each other. The interface chip and the core chip are electrically coupled to each other by a measurement signal wiring including a through electrode and a reference signal wiring. Specifically, Patent Literature 2 proposes providing a signal generation circuit and a signal judgment circuit on the interface chip, transmitting a test clock and a predetermined measurement signal to the core chip from the signal generation circuit, and detecting a phase difference of the predetermined measurement signals received via the measurement signal wiring and the reference signal wiring.

Both of Patent Literature 1 and Patent Literature 2 propose a test method of a semiconductor device having semiconductor chips with through electrodes after the semiconductor device has been assembled into a product. Furthermore, a connection state is confirmed by electrically coupling signal through electrodes and confirming a connection state of signal wirings between the semiconductor chips.

According to inventors' study, it has been found that, if a connection failure or defect occurs between semiconductor chips, the connection failure widely extends not only to signal through electrodes, but also to the vicinity of the signal through electrodes. If such a connection failure or defect can be detected at an early stage, a semiconductor chip can be restacked, so that a remarkable increase of yields of products can be expected.

SUMMARY OF THE INVENTION

The present invention has been made from the aforementioned points of view.

Thus, the present invention seeks to provide a semiconductor device which solves at least one of the above-mentioned points.

According to a first aspect of the present invention, there is provided a semiconductor device comprising a first chip including a plurality of first bumps and a plurality of first wirings, and a second chip including a plurality of second bumps and a plurality of second wirings, and being stacked with the first chip such that each of the second bumps is coupled to a corresponding one of the first bumps of the first chip, wherein the first wirings, the first bumps, the second wirings, and the second bumps constitute a single electrical path, and the first wirings, the first bumps, the second wirings and the second bumps are arranged in series with one another in the single electrical path.

According to a second aspect of the present invention, there is provided a semiconductor chip comprising a first surface and a second surface opposite to the first surface, a first group of dummy bumps on the first surface, a second group of dummy bumps on the second surface, and wirings which are placed within the semiconductor chip and which electrically connect the dummy bumps of the first and the second groups, wherein the wirings include first wirings which connect two of the dummy bumps of the first group, and second wirings which connect two of the dummy bumps of the second group.

According to a third aspect of the present invention, there is provided a method of measuring a semiconductor device which has a plurality of semiconductor chips bonded to each other through dummy bumps of each semiconductor chip, comprising constituting a single electrical path which extends through the dummy bumps and internal wirings of the plurality of the semiconductor chips connected to the dummy bumps and which is connected in series with the dummy bumps and the internal wirings of the plurality of the semiconductor chips and detecting whether or not the single electrical path is normal.

BRIEF DESCRIPTION OF THE DRAWINGS

The above features and advantages of the present invention will be more apparent from the following description of certain preferred embodiments taken in conjunction with the accompanying drawings, in which:

FIG. 2A is a cross-sectional view explanatory of a basic configuration of normal signal TSVs and signal bumps;

FIG. 2B is a diagram simplifying electric connections of FIG. 2A;

FIG. 3A is a cross-sectional view showing connections of conduction measurement TSVs and dummy bumps according to the present invention;

FIG. 3B is a diagram simplifying electric connections of FIG. 3A;

DETAILED DESCRIPTION OF THE PREFERRED EMBODIMENTS

Figure 1A:
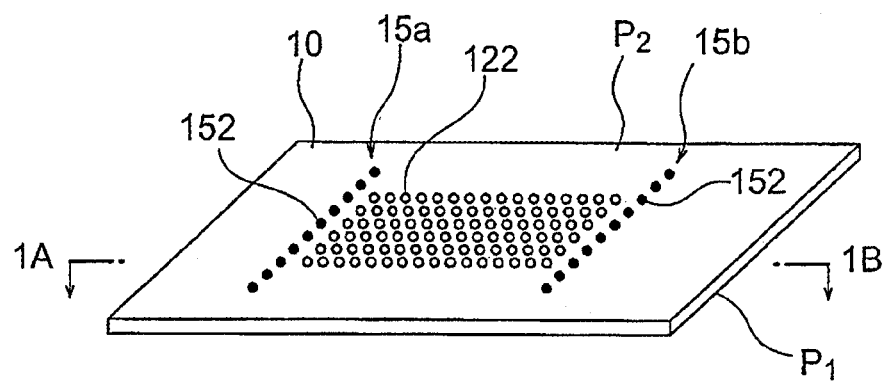
FIG. 1A is a perspective view showing a semiconductor chip according to an embodiment of the present invention.
Figure 1B:
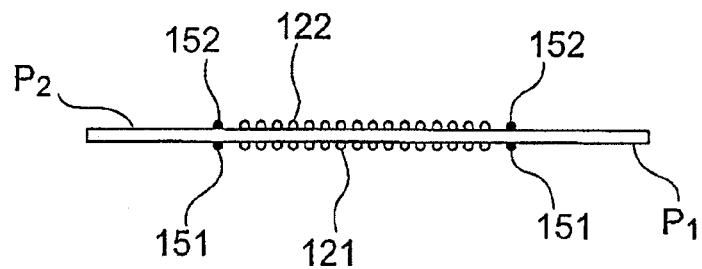
FIG. 1B is a cross-sectional view taken along line 1A-1B of FIG. 1A.

FIGS. 1A and 1B are a perspective view and a cross-sectional view showing a semiconductor chip 10 according to an embodiment of the present invention. The semiconductor chip 10 will be explained as being a DRAM. Nevertheless, semiconductor chips to which the present invention is applicable are not limited to a DRAM, and the present invention may be applied to an SRAM and a non-volatile memory, such as a flash memory, a ReRAM, an MRAM, a PRAM, and the like. For convenience of explanation, a lower surface of the semiconductor chip 10 illustrated in FIGS. 1A and 1B is referred to as a first surface P1, and an upper surface of the semiconductor chip 10 illustrated in FIGS. 1A and 1B is referred to as a second surface P2.

The semiconductor chip 10 includes a large number of signal through electrodes formed at a central portion of the semiconductor chip 10. Those signal through electrodes are hereinafter referred to as signal TSVs. The signal TSVs extend through the semiconductor chip 10 from the first surface P1 to the second surface P2. The signal TSVs include not only signal TSVs for transmitting/receiving signals such as data signals, address signals, and clock signals, but also signal TSVs for supplying a power source voltage.

The semiconductor chip 10 includes first signal bumps 121 provided on the signal TSVs of the first surface P1 and second signal bumps 122 provided on the signal TSVs of the second surface P2. Thus, the first and second signal bumps 121 and 122 are electrically coupled to each other in a one-to-one relationship via the corresponding signal TSVs. In other words, the first and second signal bumps 121 and 122 are arranged at corresponding positions of the first and second surfaces P1 and P2 of the semiconductor chip 10.

The semiconductor chip 10 illustrated in FIG. 1A further includes dummy bump arrays 15a and 15b arranged on the first and second surfaces P1 and P2. The dummy bump arrays 15a and 15b are provided so as to interpose therebetween an area of the first signal bumps 121 or the second signal bumps 122 coupled to the signal TSVs. Since the dummy bump arrays 15a and 15b have the same configuration, the dummy bump array 15a will primarily be described below.

The dummy bump array 15a includes a first dummy bump group 151 formed on the first surface P1 and a second dummy bump group 152 formed on the second surface P2. The first and second dummy bump groups 151 and 152 have connection arrangements that are different from those of the first and second signal bumps 121 and 122.

Specific configurations of the signal bumps 121 and 122 and the signal TSVs will be described below with reference to FIG. 2A. As shown in FIG. 2A, the semiconductor chip 10 has a silicon substrate 21 and an insulator layer 23 formed on the silicon substrate 21. The silicon substrate 21 includes signal TSVs 25 provided therein. The signal TSVs 25 extend to part of the insulator layer 23. The signal TSVs 25 are coupled to the first signal bumps 121. An insulating ring 27 is formed around each of the signal TSVs 25.

Meanwhile, multilayer metallic wirings 29 are provided in the insulator layer 23. The multilayer metallic wirings 29 are coupled to the second signal bumps 122 and also electrically coupled to the signal TSVs.

Thus, the first signal bumps 121 and the second signal bumps 122 are electrically coupled to each other via the signal TSVs 25 and the multilayer metallic wirings 29.

FIG. 2B illustrates simplified connection arrangements of FIG. 2A. In FIG. 2B, a set of a signal TSV 25 and a multilayer metallic wiring is represented by a single line.

FIG. 3A illustrates connection arrangements of the dummy bumps of the dummy bump groups 151 and 152 shown in FIGS. 1A and 1B. The first dummy bumps 151d1-151d3 are provided on the first surface P1 of the semiconductor chip 10. The second dummy bumps 152d1-152d3 are provided on the second surface P2 of the semiconductor chip 10. The first dummy bumps 151d1-151d3 and the second dummy bumps 152d1-152d3 are placed at corresponding positions like in the case of the first signal bumps 121 and the second bumps 122.

Furthermore, the first dummy bumps 151d1-151d3 are electrically coupled to dummy TSVs 31a-31c formed in the silicon substrate 21. An insulating ring 32 is formed around each of the dummy TSVs 31a-31c. Specifically, the dummy TSV 31a is coupled to a first dummy metallic wiring 33a in the insulator layer 23. The dummy TSVs 31b and 31c are coupled to a second dummy metallic wiring 33b. As described above, the signal TSVs and the dummy TSVs have substantially the same configuration.

Meanwhile, the second dummy bumps 152d1-152d3 differ from the signal bumps 121 and 122 shown in FIG. 2 in that they are not coupled directly to the corresponding dummy TSVs 31a-31c. Specifically, in the example illustrated in FIG. 3A, the dummy bumps 152d1 and 152d2 are coupled to each other via a third dummy metallic wiring 33c, and the dummy bump 152d3 is coupled to a fourth dummy metallic wiring 33d.

Thus, FIG. 2A and FIG. 3A differ from each other in the structure of the multilayer metallic wirings. Specifically, the multilayer metallic wirings shown in FIG. 2A are used to electrically couple the corresponding first and second signal bumps while the multilayer metallic wirings shown in FIG.

3A do not couple the corresponding first or second dummy bumps to each other. The multilayer metallic wirings of FIG. 3A are used to establish a different electric connection from that of FIG. 2A. Therefore, connections between the dummy TSVs 31a-31c differ from the connections of the signal TSVs.

FIG. 3B shows simplified connections between the dummy bumps 151d1-151d3 and 152d1-152d3 illustrated in FIG. 3A. In FIG. 3B, a set of a dummy TSV and a dummy metallic wiring is represented by a single line.

Figure 4:
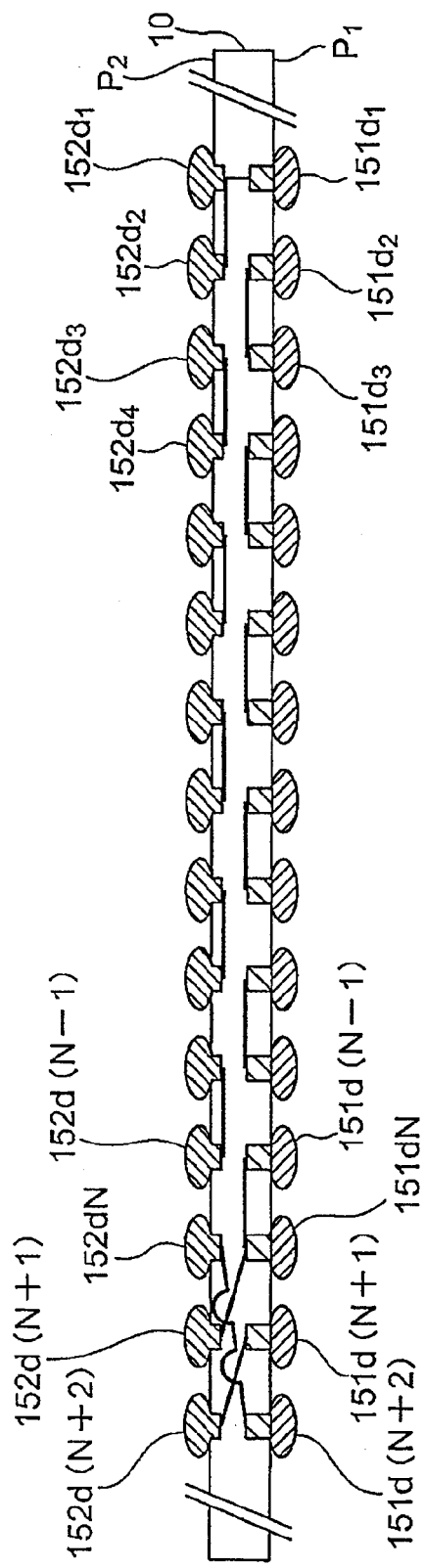
FIG. 4 is a diagram showing connections of dummy bumps of a semiconductor chip according to the embodiment of the present invention.

A specific configuration of a semiconductor chip according to an embodiment of the present invention will be described below with reference to FIG. 4. FIG. 4 is a cross-sectional view showing a part of the dummy bump array 15a illustrated in FIG. 1B. The details of the cross-section are as shown in FIG. 3A. The illustrated first dummy bump group 151 on the first surface P1 includes a first dummy bump 151d1 to an (N+2)th dummy bump 151d(N+2). The second dummy bump group 152 on the second surface P2 includes a first dummy bump 152d1 to an (N+2)th dummy bump 152d(N+2).

The first dummy bump 151d1 and the first dummy bump 152d1 are connected to each other. Furthermore, the Nth dummy bump 151dN and the (N+1)th dummy bump 152d(N+1), the (N+1)th dummy bump 151d(N+1) and the (N+2)th dummy bump 152d(N+2), and the (N+2)th dummy bump 151d(N+2) and the Nth dummy bump 152dN are respectively connected to each other. Connection parts between the dummy bumps of the first and second dummy bump groups 151 and 152 are referred to as interconnection parts.

Two adjacent dummy bumps of the second to Nth dummy bumps 151d2-151dN of the first dummy bump group 151 are coupled to each other. For example, dummy bumps 151d2 and 151d3, dummy bumps 151d4 and 151d5, ..., and dummy bumps 151d(N-1) and 151dN are respectively coupled to each other in the first dummy bump group 151. Connection parts connecting between the dummy bumps of the first dummy bump group 151 are referred to as first group connection parts.

Meanwhile, two adjacent dummy bumps of the first to (N-1)th dummy bumps 152d2-152d(N-1) of the second dummy bump group 152 are connected to each other in the illustrated manner. For example, dummy bumps 152d1 and 152d2, dummy bumps 152d3 and 152d4, ..., and dummy bumps 152d(N-2) and 152d(N-1) are respectively coupled to each other in the second dummy bump group 152. Connection parts between the dummy bump of the second dummy bump group 152 are referred to as second group connection parts.

Thus, two adjacent dummy bumps on each of the first and second surfaces P1 and P2 are connected to each other in each surface P1 and P2. A connection side of the dummy bumps provided on the first surface P1 is opposite to a connection side of the dummy bumps provided on the second surface P2. In other words, when a dummy bump on the first surface P1 (e.g., the dummy bump 151d3) is connected to a rightward dummy bump, the corresponding dummy bump on the second surface P2 (e.g., the dummy bump 152d3) is connected to a leftward dummy bump.

Furthermore, configurations of the first and second group connection parts on the first and second surfaces P1 and P2 shown in FIG. 4 may alternatively be expressed in the following manner: It is assumed that numbers 1 to N are assigned to the dummy bumps that constitute each of the first and second group connection parts where N is an even number. In this case, the first group connection parts include connecting portions between the (n+1)th dummy bump and the (n+2) th dummy bump adjacent to each other where n is an odd number smaller than N, whereas the second group connection parts include connecting portions between the nth dummy bump and the (n+1)th dummy bump adjacent to each other.

According to the present invention, a plurality of semiconductor chips 10 each including the dummy bump groups 151 and 152 as illustrated in FIG. 4 are prepared. Those semiconductor chips are stacked so as to produce a semiconductor device having a multilayer structure. In other words, the semiconductor chips 10 being stacked have the same structure in configurations of the dummy bump groups 151 and 152 and the signal bumps 121 and 122 having the same structure.

Figure 5:
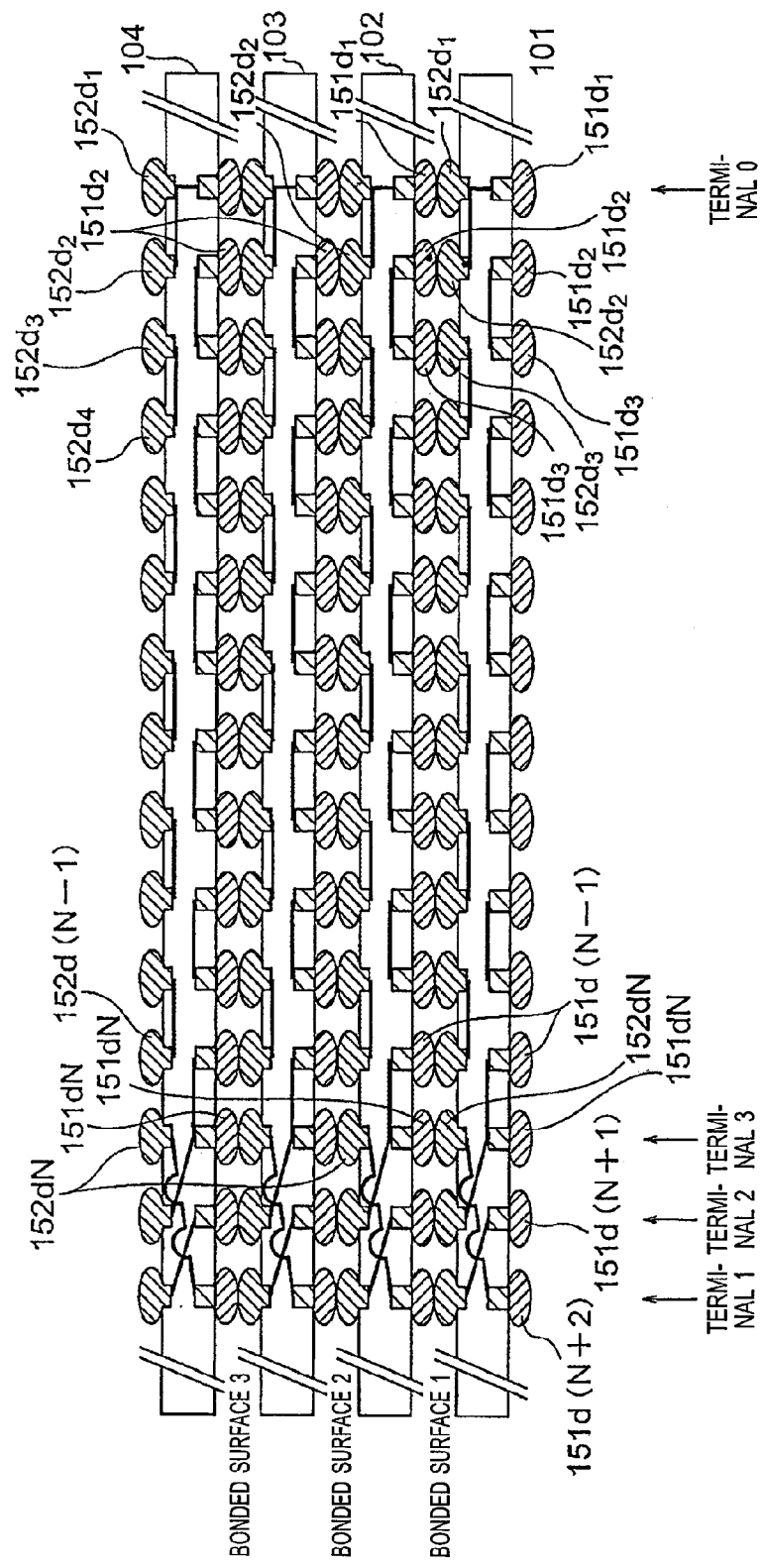
FIG. 5 is a diagram for use in explaining conduction paths of dummy bumps in a semiconductor device which stacks the semiconductor chips as shown in FIG. 4.

FIG. 5 shows a semiconductor device in which four semiconductor chips 10 as illustrated in FIG. 4 have been stacked. Each of the semiconductor chips 101-104 has the same structure as the semiconductor chip 10 illustrated in FIG. 4. FIG. 5 only shows the first and second dummy bump groups. A bonded surface 1 is formed between the first and second semiconductor chips 101 and 102. Similarly, a bonded surface 2 is formed between the second and third semiconductor chips 102 and 103, and a bonded surface 3 is formed between the third and fourth semiconductor chips 103 and 104.

In FIG. 5, a first dummy bump 151d1 of the first dummy bump group of the first semiconductor chip 101 is connected to a first dummy bump 152d1 of the second dummy bump group of the semiconductor chip 101. Furthermore, the first dummy bump 151d1 of the first dummy bump group of the first semiconductor chip 101 is connected to first dummy bumps 151d1 and 152d1 of the second semiconductor chip 102. Similarly, the first dummy bump 151d1 of the first dummy bump group of the first semiconductor chip 101 is electrically connected to first dummy bumps 151d1 and 152d1 of the third and fourth semiconductor chips 103 and 104.

Furthermore, a second dummy bump 152d2 of the second dummy bump group of the first semiconductor chip 101 is connected to a second dummy bump 151d2 of the first dummy bump group of the second semiconductor chip 102 and also connected to a third dummy bump 152d3 of the first semiconductor chip 101 via a third dummy bump 151d3 of the second semiconductor chip 102. Other dummy bumps of the first semiconductor chip 101 and the second semiconductor chip 102 are connected to each other in the same manner as described above. Thus, dummy bumps of the first semiconductor chip 101 are successively connected to those of the second semiconductor chip 102 until a dummy bump 151N of the second semiconductor chip 102 is connected to a dummy bump 152N of the first semiconductor chip 101.

Those connecting relationships of the dummy bumps similarly apply to connecting relationships of the dummy bumps of the second and third semiconductor chips 102 and 103 and also apply to connecting relationships of the dummy bumps of the third and fourth semiconductor chips 103 and 104.

Furthermore, the Nth dummy bump 152dN of the second dummy bump group 152 of the first semiconductor chip 101 is connected to the Nth dummy bump 151dN of the first dummy bump group 151 of the second semiconductor chip 102. The (N+1)th dummy bump 152d(N+1) of the first semiconductor chip 101 is connected to the (N+1)th dummy bump 151d(N+1) of the second semiconductor chip 102. The (N+2) th dummy bump 152d(N+2) of the first semiconductor chip 101 is connected to the (N+2)th dummy bump 151d(N+2) of the second semiconductor chip 102. The dummy bumps 152d(N+2) and the dummy bumps 151d(N+2) provided on the second and third semiconductor chips 102 and 103 are connected in the same manner as described above. The third and fourth semiconductor chips 103 and 104 are also connected in the same manner.

Specifically, if the rightmost dummy bump 151*d*1 illustrated in FIG. 5 is defined as a terminal 0, a conduction path coupled to the terminal 0 reciprocally intersects the bonded surface 1 between the first semiconductor chip 101 and the second semiconductor chip 102 and extends to the leftmost dummy bump 151*d*(N+2) of the first semiconductor chip 101 through the dummy bump 151*d*N of the second semiconductor chip 102 and the dummy bump 152*d*N of the first semiconductor chip 101. If the leftmost dummy bump 151*d*(N+2) is defined as a terminal 1, the conduction path from the terminal 0 to the terminal 1 intersects the bonded surface 1 a plurality of times.

Furthermore, a conduction path extending from the terminal 0 to the bonded surface 2 is connected to the dummy bump 151*d*2 formed on the first surface of the third semiconductor chip 103 via an inside connection part of the dummy bumps 152*d*1 and 152*d*2 formed on the second surface of the second semiconductor chip 102. The conduction path alternately intersects the bonded surface 2 between the second semiconductor chip 102 and the third semiconductor chip 103 and reaches the dummy bump 152*d*N of the second semiconductor chip 102. The conduction path is connected to the dummy bump 151*d*(N+1) of the first semiconductor chip 101, which is indicated as a terminal 2, via the interconnection parts from the dummy bump 152*d*N. Thus, a conduction path extending across the bonded surface 2 is formed.

A conduction path extending from the terminal 0 to the bonded surface 3 is connected to the dummy bump 151*d*2 formed on the first surface of the fourth semiconductor chip 104 via an inside connection part of the dummy bumps 152*d*1 and 152*d*2 formed on the second surface of the third semiconductor chip 103. The conduction path alternately or reciprocally intersects the bonded surface 3 between the third semiconductor chip 103 and the fourth semiconductor chip 104 and reaches the dummy bump 152*d*N of the third semiconductor chip 103. The connection path is connected to the dummy bump 151*d*N of the first semiconductor chip 101, which is indicated as a terminal 3, via the interconnection parts from the dummy bump 152*d*N. Thus, a conduction path extending across the bonded surface 3 is formed.

In the semiconductor device having the above structure, since dummy bumps are configured in the aforementioned manner on the first to fourth semiconductor chips 101-104, it is possible to examine whether or not any disconnection or opening takes place within the conduction paths formed through the bonded surfaces 1-3. Herein, disconnection may include, for example, electrical disconnection caused by shape defects of a dummy TSV or disconnection of a metallic dummy wiring. Opening may include, for example, separation of dummy bumps in a bonded surface, that results from warp of a semiconductor substrate or electrical disconnection that results from interposition of an insulator between dummy bumps.

Figure 6:
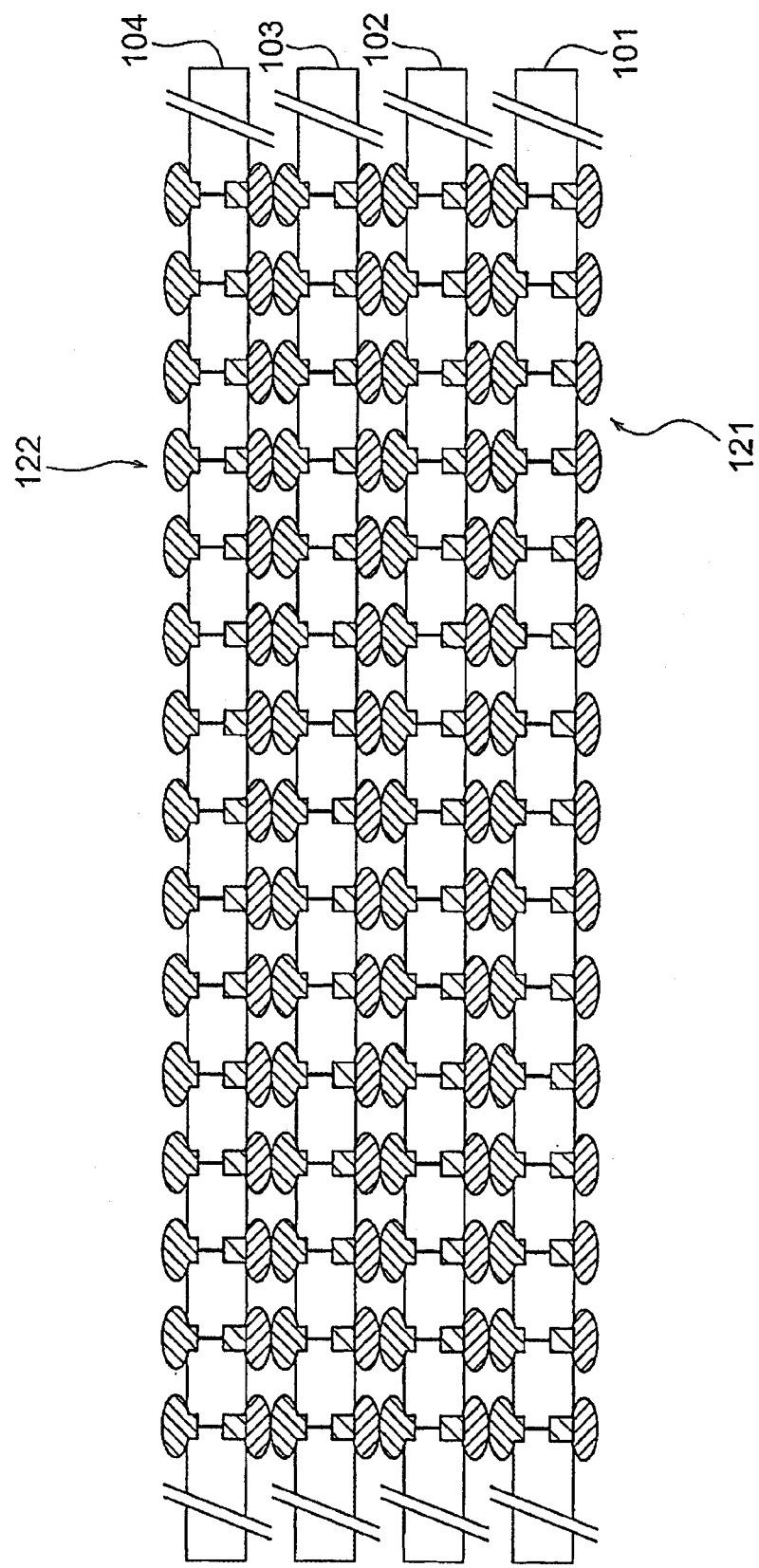
FIG. 6 is a diagram that compares connections of signal TSVs and signal bumps in a semiconductor device having a multilayer structure with FIG. 5.

FIG. 6 shows a state of connecting the signal TSVs and the signal bumps 121 and 122 of the semiconductor device including the semiconductor chips 101-104 illustrated in FIG. 5. The signal TSVs are electrically continuously connected from the signal bump 121 provided on the lower surface of the first semiconductor chip 101 to the signal bump 122 provided on the upper surface of the fourth semiconductor chip 104. Thus, conduction paths of the signal TSVs and the signal bumps 121 and 122 extend in a stacking direction.

With the aforementioned configuration, for example, the present invention can exhibit the following advantageous effects.

When a signal TSV or a signal bump has any defect, a semiconductor device including such a signal TSV or a signal bump becomes defective irrespective of the quality of a dummy TSV and a dummy bump. On the other hand, when a signal TSV or a signal bump has no defect, there is no problem in connection with a semiconductor device including such a signal TSV or a signal bump, even if the aforementioned disconnection or opening takes place in a dummy TSV or a dummy bump. This is because the dummy TSV and the dummy bump are not used in a normal operation of the semiconductor device.

Herein, it is assumed that any defect or malfunction is caused to occur in a dummy TSV and/or a dummy bump of a semiconductor device manufactured by a certain semiconductor manufacturing apparatus and semiconductor devices are subsequently and continuously manufactured by the same semiconductor manufacturing apparatus. In this event, there may be a probability that any malfunction takes place also in the semiconductor devices continuously manufactured by the use of the same semiconductor manufacturing apparatus due to some changes of conditions (size or manufacturing processes of those semiconductor devices), when the malfunction or defect appears in a dummy TSV and/or a dummy bump. Therefore, in consideration of subsequent manufacturing processes, it is preferable to form dummy TSVs and dummy bump without any defects or malfunctions. The present invention is very effective to prevent such possible connection defects that might appear in the future.

The present invention can detect the aforementioned connection defect early and readily with dummy bumps provided on each of semiconductor chips as shown in FIG. 5.

Figure 7A:
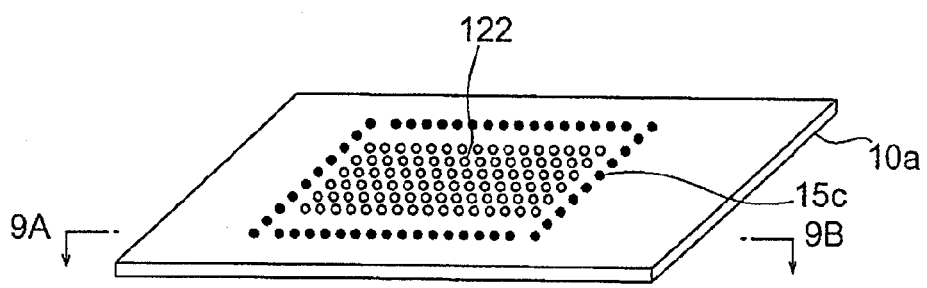
FIGS. 7A and 7B are diagrams for use in explaining an arrangement of dummy bumps according to an example of the present invention.
Figure 7B:
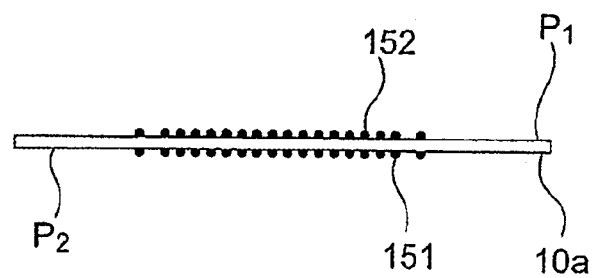

In the above embodiment, the dummy bump arrays 15*a* and 15*b* are arranged as shown in FIG. 1A. The arrangement of the dummy bump arrays is not limited to FIG. 1A. The dummy bump arrays may be formed so as to surround signal bumps as shown in FIGS. 7A and 7B. The dummy bump arrays 15*c* shown in FIGS. 7A and 7B are close to the signal bumps 122.

Figure 8A:
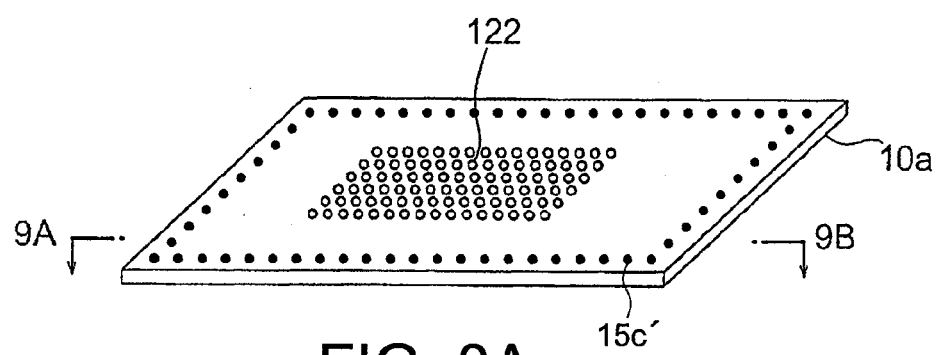
FIGS. 8A and 8B are diagrams for use in explaining an arrangement of dummy bumps according to still another example of the present invention.
Figure 8B:
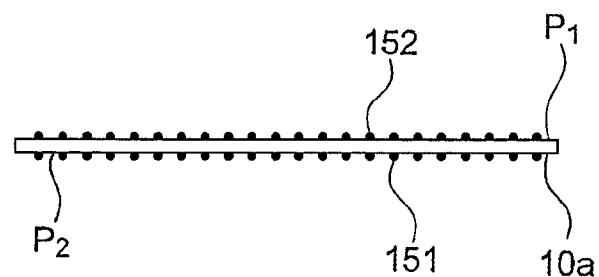

However, the arrangement of the dummy bump arrays is not limited to FIGS. 7A and 7B. As shown in FIGS. 8A and 8B, the dummy bump arrays 15*c*' may be arranged at a periphery of a chip. Furthermore, only one dummy bump array may be provided along one side of a chip. Alternatively, two, three, or four dummy bump arrays may be provided along two, three, or four sides of a chip. At any rate, the first and second dummy bump groups 151 and 152 may independently be connected to each other on each side of a chip in the same manner as illustrated in FIG. 5, or may be connected to each other in a manner in which they are continuously electrically connected through four sides of a chip. In any event, a conduction path may reciprocally or alternately intersect a bonded surface.

Figure 9A:
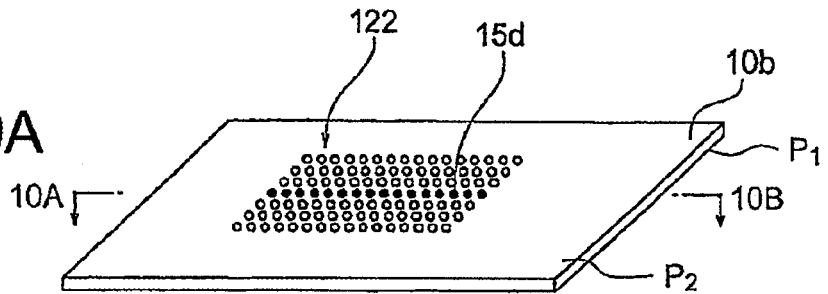
FIGS. 9A and 9B are diagrams for use in explaining an arrangement of dummy bumps according to yet still another example of the present invention.
Figure 9B:
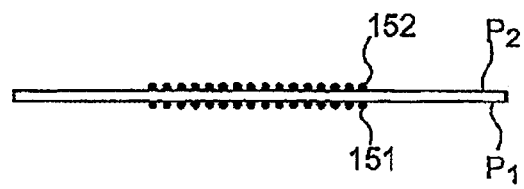

FIGS. 9A and 9B show a semiconductor chip 10*b* according to another embodiment of the present invention. In this example, there are no signal bumps 122 connected to signal TSVs at a central portion of the semiconductor chip 10*b*. Instead, a dummy bump array 15*d* is arranged straight at the central portion of the semiconductor chip 10*b*. The dummy bump array 15*d* of this example has first and second dummy bump groups 151 and 152 provided on a first surface P1 and a second surface P2, respectively. For example, those first and second dummy bump groups 151 and 152 are connected to each other in the manner illustrated in FIG. 5. With this configuration, a continuity test or a conduction test can readily be performed in a case where semiconductor chips 10*b* are stacked.

Figure 10A:
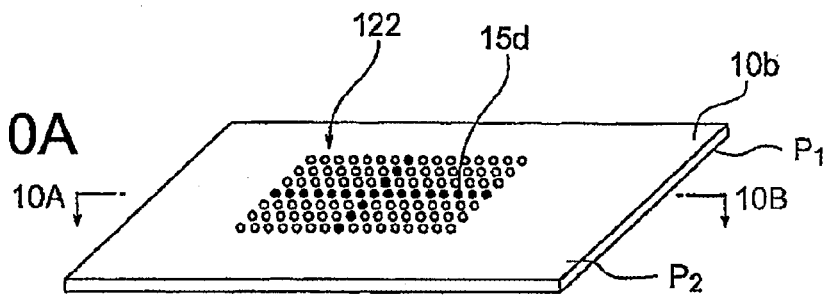
FIGS. 10A and 10B are diagrams for use in explaining an arrangement of dummy bumps according to still another example of the present invention.
Figure 10B:
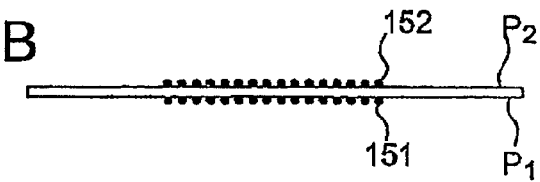

FIGS. 10A and 10B show a semiconductor chip 10*c* according to still another embodiment of the present invention. In this example, no signal bumps 122 are disposed in a crisscross area left at a central portion of the semiconductor chip 11c. Instead, a dummy bump array 15e is arranged in the crisscross area in a cruciform manner. The dummy bump array 15e of this example has a first dummy bump group 151 provided on a first surface P1 and a second dummy bump group 152 provided on a second surface P2. The first and second dummy bump groups 151 and 152 may independently be connected to each other on each of the two crossed lines, or may be connected to each other in a manner in which they are continuous on the two crossed lines.

In the above examples, the first and second dummy bump groups are arranged straight. The arrangement of the dummy bump groups according to the present invention is not limited to a straight arrangement. The dummy bump groups may be arranged on curved lines.

Figure 11:
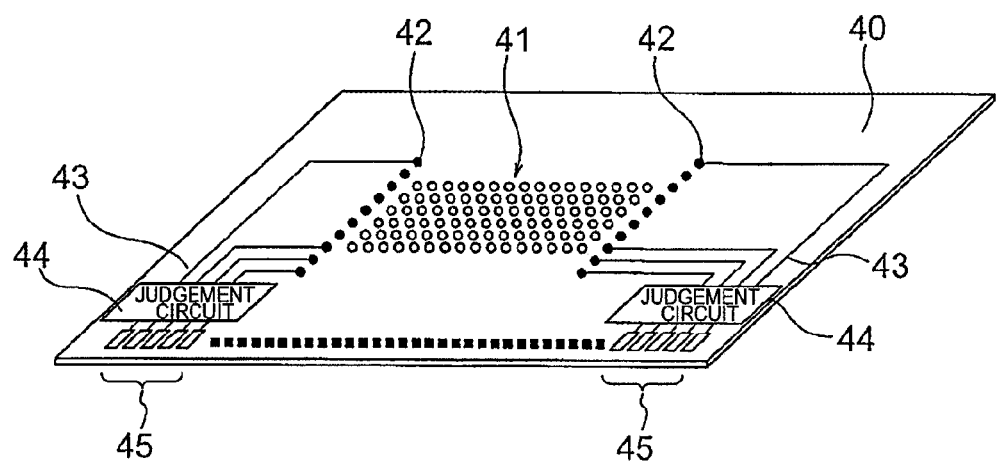
FIG. 11 is a diagram showing an interposer or control chip for mounting stacked semiconductor chips.

FIG. 11 shows an interposer chip 40 having a multilayer structure (e.g., the multilayer structure shown in FIGS. 5 and 6). Specifically, the interposer chip 40 forms a part of a semiconductor device together with the stacked semiconductor chips 101-104 illustrated in FIG. 5 or the like. For example, the interposer chip 40 may be an interface chip of a DRAM.

The illustrated interposer chip 40 has a rectangle shape and has signal TSVs 41 provided at a central area thereof and two lines of conduction measurement TSVs 42 arranged linearly in two areas interposing the central area. For example, each line of the conduction measurement TSVs 42 is connected to the first dummy bump group 151 of the first semiconductor chip 101 of FIG. 5. Furthermore, the conduction measurement TSVs 42 are connected to judgment circuits 44 via connection lines 43 for conduction. Each of the judgment circuits 44 is connected to input/output signal pads 45. In this example, the input/output signal pads 45 are used for input and output of normal input/output signals and also used for input of bond state judgment control signals and output of measurement results during conduction measurement.

As is apparent from the description in connection with FIG. 5, a conduction measurement is performed for judging a bonding state of bonded surfaces 1, 2, and 3. The number of signal pads 45 that are also used for judging a bonding state might be at least the sum of the number corresponding to the number of the terminals 0-3 (used to measure the bonded surfaces 1, 2, and 3) and the number of pads (used to input control signals for judging or detecting each bonding state).

Figure 12:
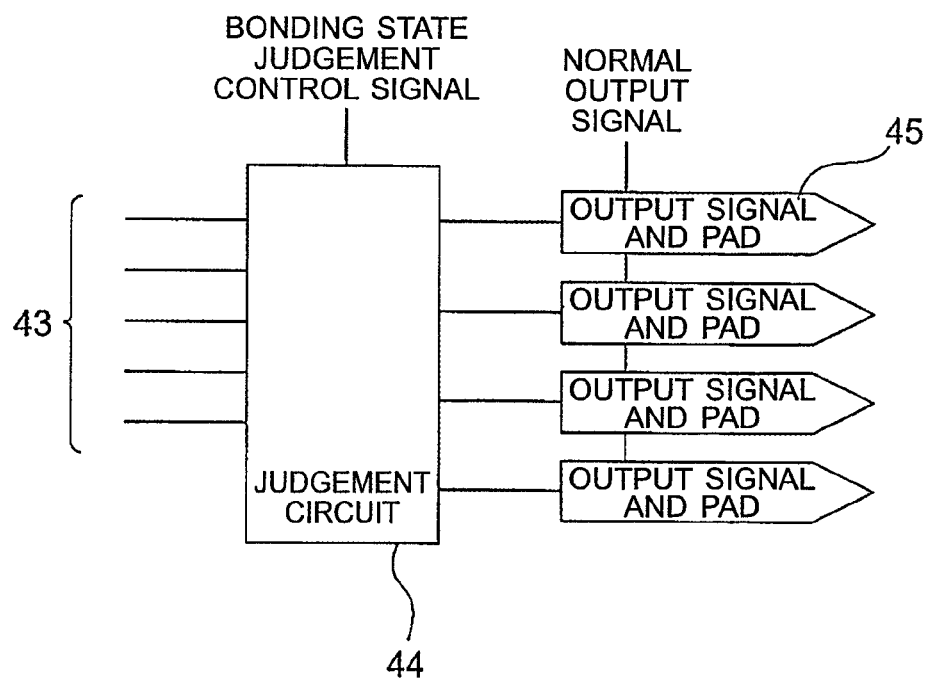
FIG. 12 is a block diagram for use in explaining connections of a judgment circuit shown in FIG. 11.
Figure 13:
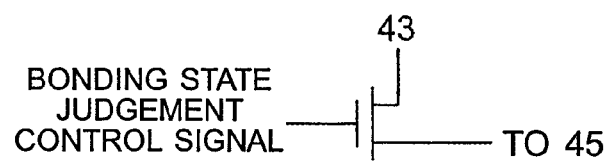
FIG. 13 is a circuit diagram showing a specific example of the judgment circuit shown in FIG. 12.

Each of the judgment circuits 44 shown in FIG. 11 has a configuration illustrated in FIG. 12. Specifically, the judgment circuit 44 is connected to the input/output signal pads 45. In response to the bond state judgment control signals, the judgment circuit 44 selects the connection lines 43 for conduction and outputs output signals from the selected connection lines 43 for conduction to the input/output pads corresponding to the bonded portions. Specifically, the judgment circuit 44 may be formed of a MOS transistor as shown in FIG. 13. The illustrated MOS transistor comprises an N-channel MOS transistor. The MOS transistor has a drain and a source connected to the connection line 43 for conduction and the input/output pad 45. In response to a bond state judgment control signal supplied to the gate, the MOS transistor is turned on so as to output a signal from the connection line 43 for conduction, i.e., a signal indicative of a result of a continuity test, to the input/output pad.

An operation of the judgment circuit 44 shown in FIGS. 12 and 13 in an example of the semiconductor device illustrated in FIG. 5 will be described with reference to FIG. 14. It is assumed that a signal having a high level is supplied to the input/output pad 45 corresponding to the terminal 0 of FIG. 5 and that a signal indicative of a continuity test result is outputted to the input/output pads 45 corresponding to the terminals 1, 2, and 3.

Figure 14:
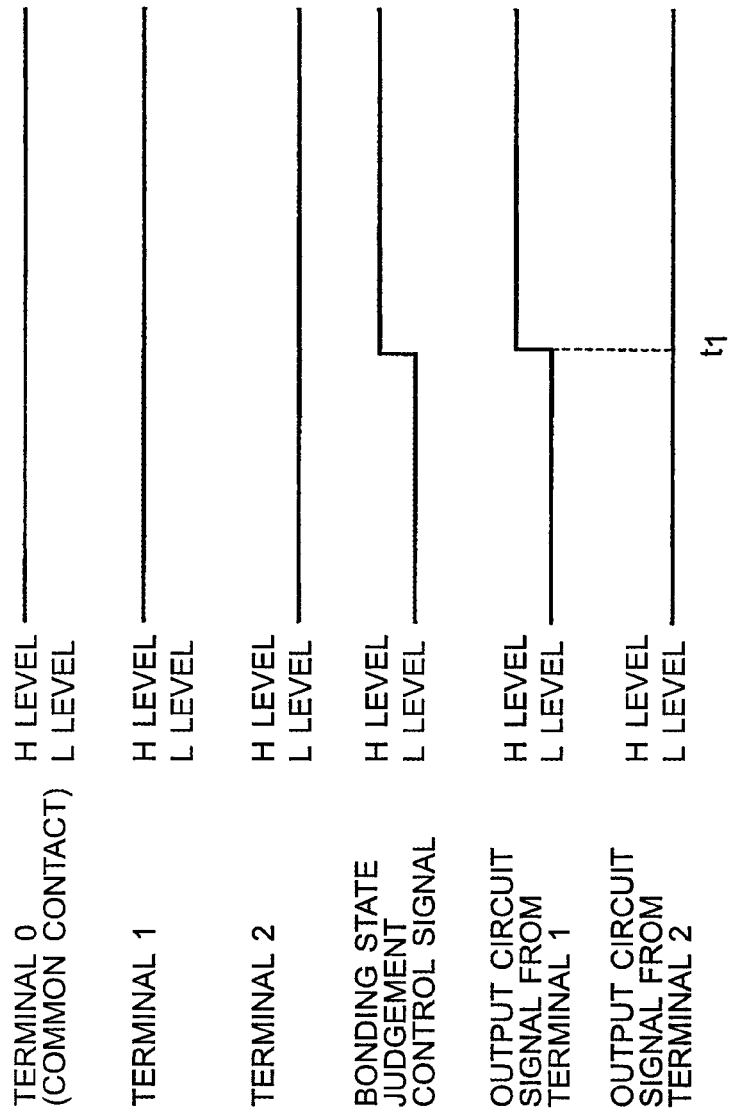
FIG. 14 is a timing chart for use in explaining an operation of the judgment circuit shown in FIGS. 11 to 13.

The example of FIG. 14 shows the case where there is no defect in a bonded surface including a conduction path between the terminal 0 and the terminal 1 but a bonding malfunction, such as an open state, is caused to occur in a bonded surface which includes a conduction path between the terminal 0 and the terminal 2.

Under the circumstances, the continuity test is performed by supplying a signal of a high level to the input/output pad 45 corresponding to the terminal 0 which is used as a common terminal.

In addition, a bonding state judgment control signal is given at a time point t1 and the connection line 43 connected to the terminal 1 is selected so that a signal indicative of a continuity test result is outputted to the input/output pad 45 from the terminal 1. In this case, since there is no problem in the conduction path between the terminal 0 and the terminal 1, as mentioned above, a signal of a high level supplied to the terminal 1 is outputted from the input/output pad 45 corresponding to the terminal 1.

On the other hand, the conduction path between the terminal 0 and the terminal 2 is in an opened state, as mentioned above. Therefore, even if an input/output pad 45 corresponding to the terminal 2 is selected by the bonding state judgment control signal and the signal of the high level is supplied from the terminal 0, the input/output pad 45 corresponding to the terminal 2 is held at the low level.

Accordingly, the bonding states of the bonded surfaces between the semiconductor chips 101-104 can be judged by detecting and measuring the level of signals outputted to the input/output pads 45.

Specifically, a method of measuring a semiconductor device as described in connection with FIGS. 11-14 is to measure bonding states of a semiconductor device in which semiconductor chips having through silicon vias (TSVs) are bonded to and stacked on each other via signal bumps. Dummy bumps are arranged, and wirings are formed between the dummy bumps of the bonded semiconductor chips so that a conduction path or paths are formed between the dummy bumps. Specifically, wirings are provided between two semiconductor chips stacked in the vertical direction so as to couple the dummy bumps to each other with a single continuous stroke.

According to the present invention, bonding states of the stacked semiconductor chips can be measured by judging whether or not conduction paths are formed between the dummy bumps thus configured.

Figure 15:
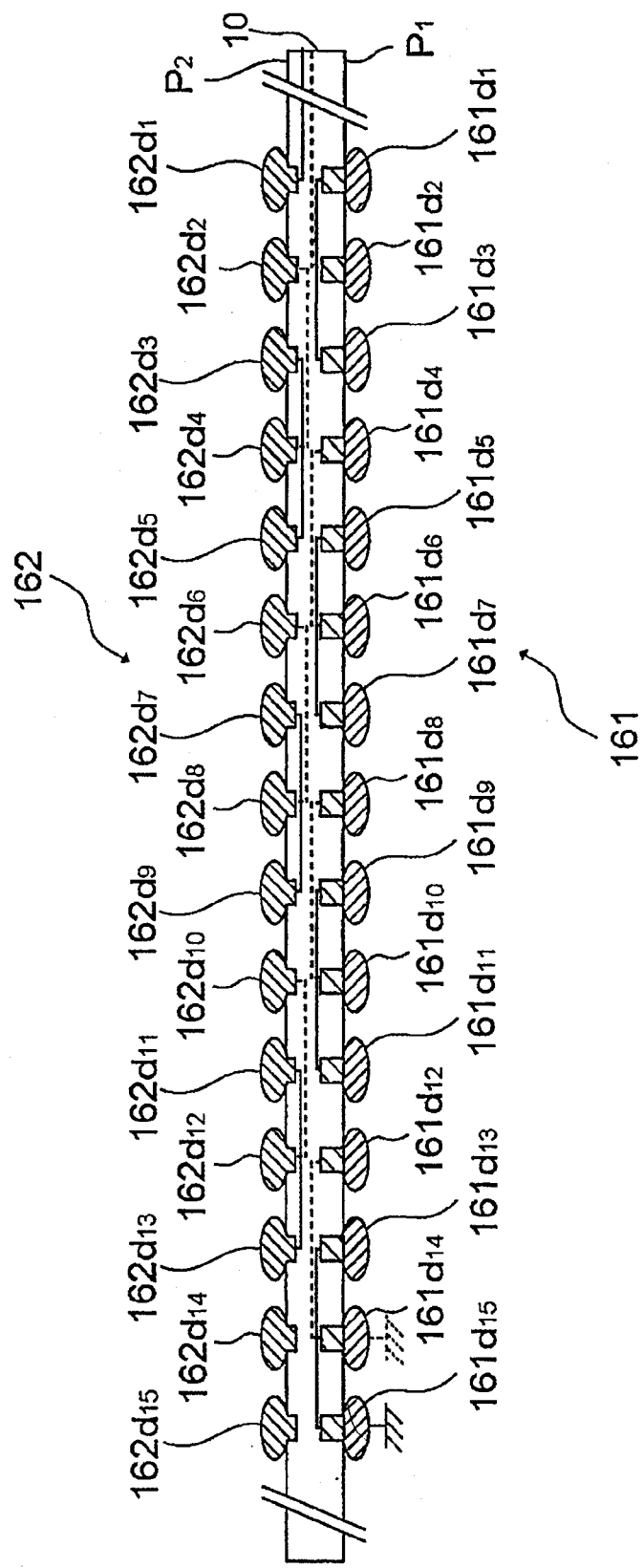
FIG. 15 is a diagram showing connections of dummy bumps of a semiconductor chip according to a further embodiment of the present invention.

Next, a specific configuration of a semiconductor chip according to still another embodiment of the present invention will be described with reference to FIG. 15. FIG. 15 shows a dummy bump array which corresponds to FIG. 4 but which is different from FIG. 4 in inside wirings of first and second dummy bump groups 161 and 162 formed on a first surface P1 and a second surface P2 of a semiconductor chip 10. The illustrated first dummy bump group 161 includes a first dummy bump 161d1 to a fifteenth dummy bump 161d15. Similarly, the second dummy bump group 162 includes a first dummy bump 162d1 to a fifteenth dummy bump 162d15. Dummy bumps of the first and second dummy bump groups 161 and 162 are placed at positions having one-to-one relationship.

Figure 16:
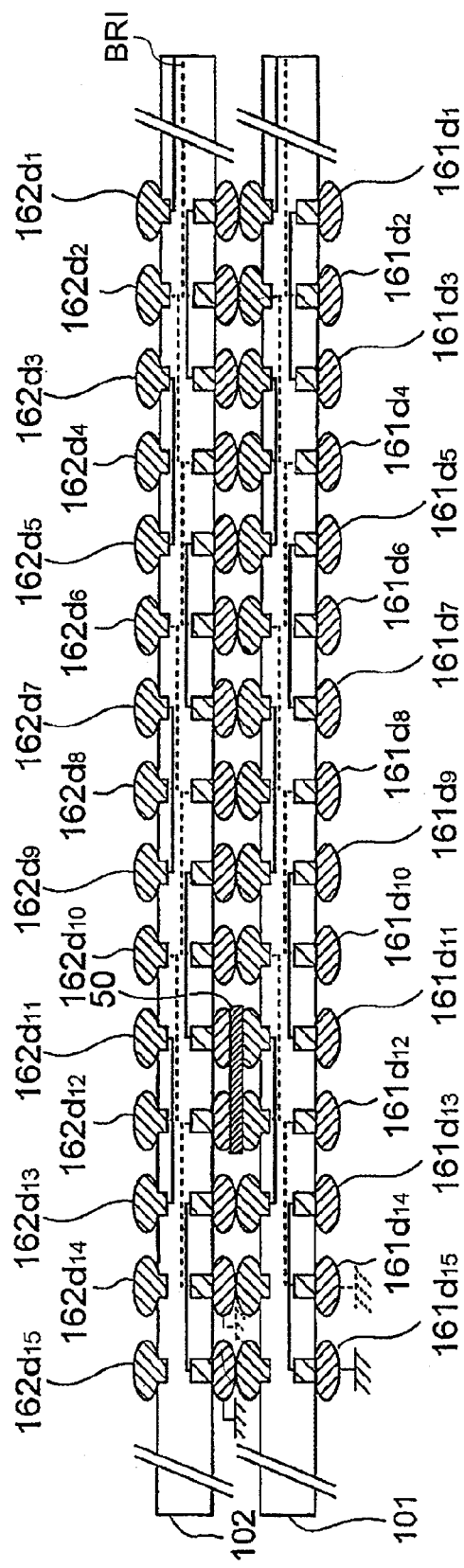
FIG. 16 is a diagram for use in explaining conduction paths of dummy bumps in a semiconductor device which stacks the semiconductor chips as shown in FIG. 15.

The connection arrangements or inside wirings of the first and second dummy bump groups 161 and 162 illustrated in FIG. 15 differ from the connection arrangements or inside wirings of the first and second dummy bump groups 151 and 152 illustrated in FIG. 4. Specifically, the first and second dummy bump groups 161 and 162 illustrated in FIG. 16 are internally connected in a manner as indicated by solid lines and broken lines. More specifically, every other dummy bump is internally connected to each other, as shown by the solid lines or broken lines and two dummy bumps connected to each other by the solid lines are located alternately with two dummy bumps connected by the broken lines in the vertical direction, as illustrated in FIG. 16.

Specifically, odd-numbered dummy bumps of the first dummy bump group 161 provided on the first surface P1 (e.g., dummy bumps 161d1 and 161d3, dummy bumps 161d5 and 161d7, and so on) are connected to each other, as shown by the solid lines. Odd-numbered dummy bumps of the second dummy bump group 162 provided on the second surface P2 (e.g., dummy bumps 162d3 and 162d5, dummy bumps 162d7 and 162d9, and so on) are connected to each other by the solid lines. A first one 162d1 of the odd-numbered dummy bump of the second surface P2 is connected to an external circuit or another odd-numbered dummy bump (not shown).

Furthermore, even-numbered dummy bumps of the first dummy bump group 161 provided on the first surface P1 (e.g., dummy bumps 161d4 and 161d6, dummy bumps 161d8 and 161d10) are connected to each other, as shown by the broken lines. A leading one 161d2 of the even-numbered dummy bumps of the first surface P1 is connected to an external circuit or another even-numbered dummy bump (not shown).

Even-numbered dummy bumps of the second dummy bump group 162 provided on the second surface P2 (e.g., dummy bumps 162d2 and 162d4, dummy bumps 162d6 and 162d8) are connected to each other, as shown by the broken lines. Thus, even-numbered dummy bumps on the first and second surfaces P1 and P2 are each connected to each other alternately in the vertical direction. This shows that each of the odd-numbered dummy bumps and the on the second surface P2 is connected in series to each other when another semiconductor chip is stacked and the odd-numbered and the even-numbered dummy bumps of another semiconductor chip are mounted to those of the illustrated semiconductor chip.

As mentioned before, the first and the second dummy bumps 162d1a and 162d2 on the second surface P2 may be connected to the external terminal.

The dummy bump 161d14 as an even-numbered end on the first surface P1 and the dummy bump 161d15 as an odd-numbered end on the first surface P1 are connected to different ground sources (e.g., VSSQ and VSS), respectively. Those ground sources may be supplied from different external terminals or may be supplied through the signal TSVs.

FIG. 16 shows a semiconductor device in which two semiconductor chips 10 illustrated in FIG. 15 are stacked.

In FIG. 16, a short-circuit portion 50 is caused to occur between the first and second semiconductor chips 101 and 102. In the illustrated example, the short-circuit portion 50 appears between the eleventh dummy bump 162d11 and the twelfth dummy bump 162d12 on the second surface P2 of the first semiconductor chip 101 and between the eleventh dummy bump 161d11 and the twelfth dummy bump 161d12 on the first surface P1 of the second semiconductor chip 102.

It is possible to detect generation or appearance of the short-circuit portion 50 shown in FIG. 16 when the semiconductor chips 101 and 102 being stacked have dummy bump groups with the configuration illustrated in FIG. 15.

As described above, the fourteenth and fifteenth dummy bumps 161d14 and 161d15 of the first and second semiconductor chips 101 and 102 are coupled to different ground sources, respectively.

In the illustrated example, a continuity test between the second dummy bump 161d2 and the fourteenth dummy bump 161d14 is performed by applying a voltage to the second dummy bump 161d2 of the second semiconductor chip 102 from the external circuit through a broken line BR1. In this case, a current path is formed from the second dummy bump 162d1 of the second semiconductor chip toward the second dummy bump 162d2 of the first semiconductor chip. Thereafter, the current path extends through the internal wirings shown by the broken lines drawn in the first and the second semiconductor chips to the fourteenth dummy bump 161d14 of the second semiconductor chip connected to the ground source.

The current path indicated by the broken lines passes through the dummy bumps 162d12 and 161d12 at the short-circuit portion 50 and reaches the fourteenth dummy bump 162d14 of the second semiconductor chip 102.

Similarly, as indicated by solid lines, another current path is formed so as to pass through the eleventh dummy bump 162d11 (on the first semiconductor chip 101) and 161d11 (on the second semiconductor chip 102) at the short-circuit portion 50 and reach the fifteenth dummy bump 161d15 of the second semiconductor chip 102.

Since the fourteenth dummy bump 162d14 and the fifteenth dummy bump 161d15 of the second semiconductor chip 102 are respectively grounded, two DC connection paths are formed via the short-circuit portion 50.

Thus, any defect or malfunction, such as the short-circuit portion 50, can be detected in the multilayer semiconductor device by detecting formation of a plurality of DC paths.

It is preferable to perform a measurement using dummy bumps according to the present invention before a continuity test of testing signal TSVs which are individually contacted.

Thus, the present invention is featured by introducing, in semiconductor chips, a TSV internal wiring pattern for completing a conduction path on bonding those semiconductor chips, and by confirming a conduction path by the use of an interposer chip.

Figure 17:
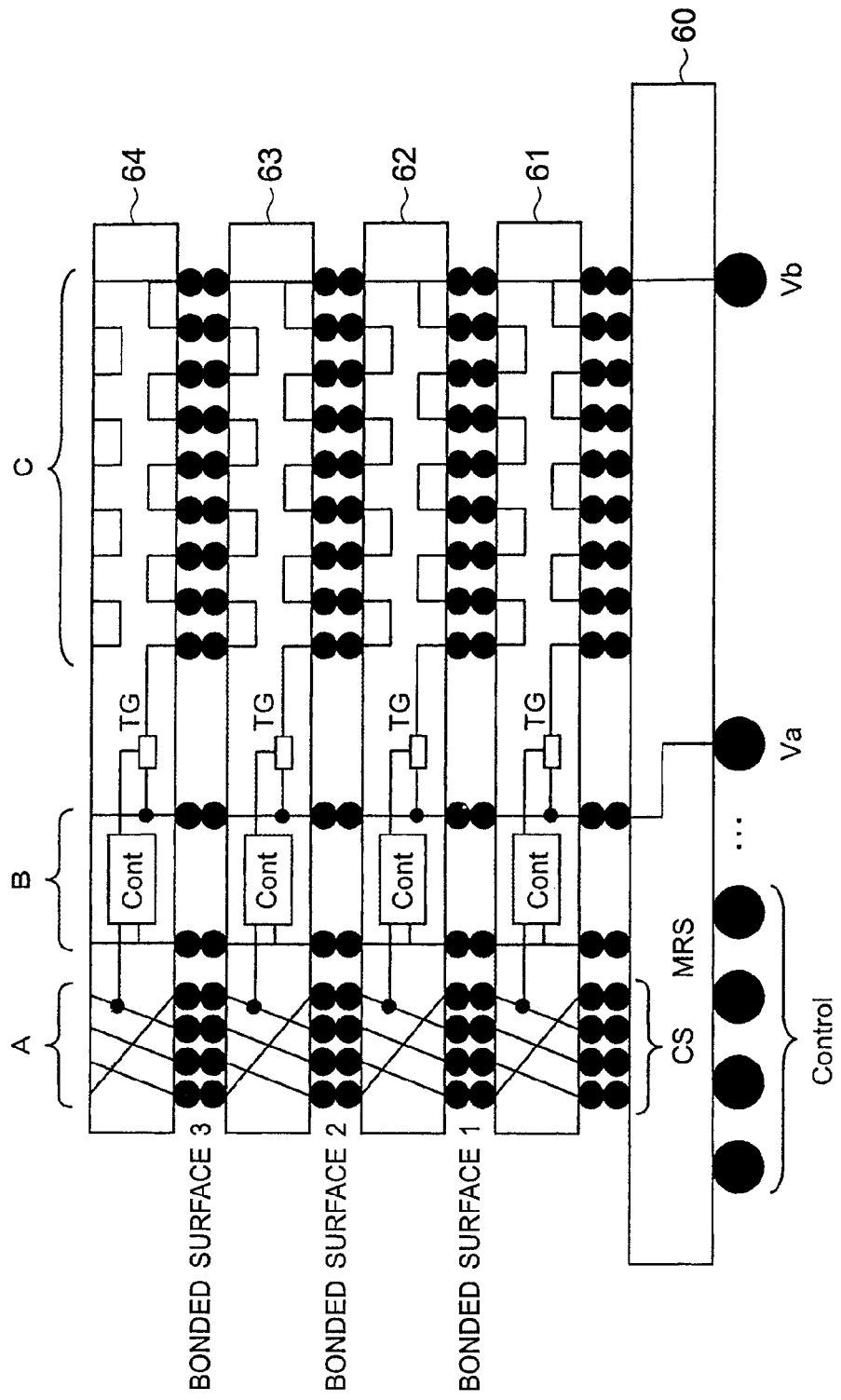
FIG. 17 is a diagram for use in explaining a semiconductor device according to a further embodiment of the present invention.

FIG. 17 illustrates still another embodiment of the present invention. For example, the semiconductor device includes a controller chip 60 located as the lowermost layer and a plurality of memory chips which are stacked on the controller chip 60 and which are called first, second, third, and fourth memory chips from the bottom of FIG. 17. In FIG. 17, each of the first, the second, the third, and the fourth memory chips 61, 62, 63, and 64 includes a plurality of dummy bumps on each of the first and the second surfaces and wirings connected to the bumps within each memory chip in a manner similar to FIG. 5. Each of the first through the fourth memory chips 61 to 64 is divided into a chip selection section A, a control section B, and a dummy bump connection section C.

Although the first through the fourth memory chips are mounted as the plurality of the memory chips on the controller chip 60 in the illustrated example, the present invention is applicable to the semiconductor device which includes at least the first and the second memory chips 61 and 62. In this connection, the first and the second memory chips 61 and 62 may be simply called first and second chips, respectively, while the control chip 60 may be called a third chip, for convenience of description. The third memory chip 63 may be called a fourth chip. In this event, the dummy bumps which are formed on the second surface of the first chip 61 and which are directed upwards of FIG. 17 may refer to as first bumps and the wirings of the first chip 61 may refer to as first wirings. Likewise, the dummy bumps on the first and the second surfaces of the second chip 62 may be called second and third bumps, respectively, and the wirings of the second chip 62 may be called second wirings. Similarly, the dummy bumps on the first and the second surfaces of the third memory chip (fourth chip) 63 may be called fourth and fifth bumps, respectively, and the wirings of the third memory chip 63 may be called third wirings.

It is to be noted that the first wirings, the first bumps, the second wirings, and the second bumps constitute a single electrical path and are arranged in series with one another in the single electrical path, when the first and the second chips are stacked to each other in the manner mentioned in FIG. 5. This applies to the semiconductor device that further includes the third memory chip 63 and/or the fourth memory chip 64 in addition to the first and the second memory chips 61 and 62.

In the foregoing embodiments, different terminals (the terminals 1-3 in FIG. 5) are individually used to perform a test of conduction paths in each of bonded surfaces. In the present embodiment, however, it is to be noted that a single terminal is used in common to perform such a test.

Now, conduction paths indicated by C in FIG. 17 correspond to the conduction paths of the dummy bumps and the dummy TSV in FIG. 5. An end of each conduction path in each of bonded surfaces is connected in common to a terminal Vb (which may be supplied with Vss, for example, and which is attached to the control chip 60). Another end of each conduction path is electrically selected by an electrical control operation, and, as a result, the selected end alone is connected to a terminal Va (which is supplied with Vdd, for example, and which is attached to the control chip 60 also). Thus, the test is performed only for the selected bonded surface. As an example of performing the test, description will be made about testing a bonded surface 2 between the second and the third memory chips 62 and 63.

In this event, a plurality of control terminals (specified by CONTROL in FIG. 17) of the control chip 60 are supplied with predetermined signals, respectively in a state in which different voltages Vdd and Vss are supplied to the terminals Va and Vb, respectively. Specifically, those predetermined signals include an MRS signal (MRS terminal) which is activated to initiate a mode for performing the test and which serves as a signal for selecting one of chip selection terminals (CS) which correspond to the first through the fourth memory chips 61 to 64 and which serve to select the bonded surface 2. The CS terminals <0:3> illustrated in FIG. 17 are numbered from 0 to 3 from the left side of FIG. 17. In this example, the third memory chip 63 from the bottom is to be activated. In this event, CS <0:3> are put into 1000 (CS0→3 from the left side of the figure). The control circuit Cont is configured to activate an output signal when CS is selected and MRS is activated. In the illustrated example, only the control circuit Cont of the third memory chip 63 from the bottom activates an output signal, whereas the control circuits Cont of the other memory chips deactivate an output signal. A transfer gate TG is a circuit that becomes an ON-state when the output signal from the control circuit Cont is activated. As a result, only the third memory chip 63 becomes an ON-state. Consequently, a conduction path can selectively be formed only in the bonded surface 2.

Herein, it is possible to apply TSV configurations shown in FIG. 2A and FIG. 3A, connections of dummy bumps shown in FIG. 4 and FIG. 15, and arrangements of dummy bumps shown in FIG. 7A, FIG. 8A, FIG. 9A, and FIG. 10A to this embodiment illustrated in FIG. 17.

INDUSTRIAL APPLICABILITY

The present invention is not limited to a DRAM and is also applicable to general semiconductor devices, such as a central processing unit (CPU), a micro control unit (MCU), a digital signal processor (DSP), an application specific integrated circuit (ASIC), an application specific standard product (ASSP) as long as the semiconductor devices have a chip-on-chip configuration (COC) with through electrodes (TSVs). Furthermore, devices to which the present invention has been applied can also be used as semiconductor devices for system-on-chip (SOC), multichip package (MCP), package-on-package (POP), and the like.

What is claimed is:

1. A semiconductor device comprising:
   a first chip including a first plurality of first bumps on a first surface and a plurality of first wirings; and
   a second chip including a plurality of second bumps and a plurality of second wirings, and being stacked with the first chip such that each of the plurality of second bumps is coupled to a corresponding one of the first plurality of first bumps of the first chip;
   wherein the first wirings, the first bumps, the second wirings, and the second bumps constitute a single electrical path, and the first wirings, the first bumps, the second wirings and the second bumps are arranged in series with one another in the single electrical path, and
   the first chip further includes a second plurality of first bumps on a second surface opposed to the first surface, the second plurality of first bumps being respectively aligned with the first plurality of first bumps in a direction perpendicular to the first and second surfaces and being electrically disconnected from the first plurality of first bumps.

2. The semiconductor device as claimed in claim 1, wherein one of the first and second bumps that is arranged at one end of the single electrical path is supplied with a first voltage and another of the first and second bumps that is arranged at the other end of the single electrical path is supplied with a second voltage different from the first voltage.

3. The semiconductor device as claimed in claim 2, further comprising a third chip on which the first and second chips are mounted, the third chip including first and second external terminals respectively supplied with the first and second voltages.

4. The semiconductor device as claimed in claim 3, wherein the first external terminal is coupled electrically to the one of the first and second bumps and the second external terminal is selectively coupled electrically to the other of the first and second bumps.

5. The semiconductor device as claimed in claim 1, wherein the second bumps are provided on a first surface of the second chip and the second chip further includes a plurality of third bumps provided on a second surface opposed to the first surface and a plurality of third wirings, the semiconductor device further comprising:
   a fourth chip including a plurality of fourth bumps and a plurality of fourth wirings, and being stacked with the second chip such that each of the fourth bumps is coupled to a corresponding one of the third bumps of the second chip;
   the third wirings, the third bumps, the fourth wirings and the fourth bumps constituting an additional single electrical path, and the third wirings, the third bumps, the fourth wirings and the fourth bumps are arranged in series with one another in the additional single electrical path.

6. The semiconductor device as claimed in claim 5, wherein one of the third and fourth bumps that is arranged at one end of the additional single electrical path is supplied with a first voltage and another of the third and fourth bumps that is arranged at the other end of the additional single electrical path is supplied with a second voltage different from the first voltage.

7. The semiconductor device as claimed in claim 6, wherein one of the first and second bumps that is arranged at one end of the single electrical path is coupled electrically to the one of the third and fourth bumps to be supplied with the first voltage.

8. The semiconductor device as claimed in claim 1, wherein each of the second wirings of the second chip includes at least one through silicon via.

9. A semiconductor device comprising:
a first chip including first and second surfaces opposed to each other; and
a second chip including third and fourth surfaces opposed to each other, and being stacked with the first chip such that the third surface faces to the first surface of the first chip;
the first chip including first, second and third bumps on a side of the first surface and a first wiring electrically connecting the second and third bumps with each other, the first bump being disconnected from each of the first and second bumps in the first chip;
the second chip including fourth, fifth and sixth bumps on a side of the third surface and a second wiring electrically connecting the fourth and fifth bumps with each other, the sixth bump being disconnected from each of the fourth and fifth bumps in the second chip; and
the first and second chips being stacked with each other such that the first, second and third bumps are coupled respectively to the fourth, fifth and sixth bumps so that the first, second, third, fourth, fifth and sixth bumps are electrically connected in series through the first and second wirings,
wherein the first chip further includes seventh, eighth and ninth bumps on the second surface, the seventh, eighth and ninth bumps being aligned with the first, second and third bumps in a second direction perpendicular to the first and second surfaces, respectively and electrically disconnected from the first, second and third bumps, respectively.

10. The semiconductor device as claimed in claim 9, wherein the first, second and third bumps of the first chip are arranged in line in a first direction horizontal to the first and second surfaces.

11. The semiconductor device as claimed in claim 9, wherein the first chip further includes tenth and eleventh bumps on the second surface and the tenth and eleventh bumps are respectively supplied with first and second voltages.

12. The semiconductor device as claimed in claim 9, wherein the first chip further includes a plurality of first signal bumps on the first surface and a plurality of second signal bumps on the second surface, each of the first signal bumps being aligned with a corresponding one of the second signal bumps in the second direction and electrically coupled to the corresponding one of the second signal bumps.

13. The semiconductor device as claimed in claim 12, wherein the first signal bumps of the first chip are arranged in matrix.

14. The semiconductor device as claimed in claim 12, wherein the first surface of the first chip is divided into first and second peripheral regions and a center region between the first and second peripheral regions, the first signal bumps being arranged in the center region, the first, second and third bumps being arranged in the first peripheral region.

15. The semiconductor device as claimed in claim 12, wherein the first, second and third bumps are arranged in a first pitch, the first signal bumps being arranged in a second pitch, the second pitch being substantially equal to the first pitch.

16. The semiconductor device as claimed in claim 15, wherein a distance between the first bump and one of the first signal bumps arranged adjacently to the first bump is greater than the second pitch.

17. The semiconductor device as claimed in claim 16, wherein the distance between the first bump and the one of the first signal bumps arranged adjacently to the first bump is greater than the first pitch.

18. The semiconductor device as claimed in claim 12, wherein the first, second and third bumps are arranged in a first pitch, the first signal bumps being arranged in a second pitch, the second pitch being different from the first pitch.

19. The semiconductor device as claimed in claim 18, wherein the first pitch is greater than the second pitch.

20. The semiconductor device as claimed in claim 9, wherein the first chip further includes:
a first semiconductor substrate;
first, second and third penetration electrodes respectively penetrating the semiconductor substrate and provided correspondingly to the first, second and third bumps; and
a first multi-level wiring structure formed on the first semiconductor substrate, the first multi-level wiring structure comprising a first lower-level wiring, and a first upper-level wiring and a first interlayer insulating film between the first lower-level wiring and the first upper-level wiring, and a plurality of first through electrodes in the first interlayer insulating film to form an electrical connection between the first lower-level wiring and the first upper-level wiring;
the first wiring being formed as one of the first lower-level wiring and the first upper-level wiring.

21. The semiconductor device as claimed in claim 20, wherein the second chip further includes:
a second semiconductor substrate;
fourth, fifth and sixth penetration electrodes respectively penetrating the second semiconductor substrate and provided correspondingly to the fourth, fifth and sixth bumps; and
a second multi-level wiring structure formed on the second semiconductor substrate, the second multi-level wiring structure comprising a second lower-level wiring, and a second upper-level wiring and a second interlayer insulating film between the second lower-level wiring and the second upper-level wiring, and a plurality of second through electrodes in the second interlayer insulating film to form an electrical connection between the second lower-level wiring and the second upper-level wiring;
the second wiring being formed as one of the second lower-level wiring and the second upper-level wiring.

22. The semiconductor device as claimed in claim 21, wherein the second wiring of the second wiring structure connects the fourth and fifth penetration electrodes to couple the fourth and fifth bumps.

* * * * *